(12) United States Patent
Krasnov et al.

(10) Patent No.: US 8,747,959 B2
(45) Date of Patent: *Jun. 10, 2014

(54) PLANAR PATTERNED TRANSPARENT CONTACT, DEVICES WITH PLANAR PATTERNED TRANSPARENT CONTACTS, AND/OR METHODS OF MAKING THE SAME

(75) Inventors: Alexey Krasnov, Canton, MI (US); Muhammad Imran, Brownstown, MI (US); Willem den Boer, Brighton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 278 days.

This patent is subject to a terminal disclaimer.

(21) Appl. No.: 13/174,362

(22) Filed: Jun. 30, 2011

(65) Prior Publication Data

US 2013/0004678 A1    Jan. 3, 2013

(51) Int. Cl.
*C08F 2/46* (2006.01)
*B05D 3/00* (2006.01)
*C23C 16/40* (2006.01)

(52) U.S. Cl.
USPC ....... 427/521; 427/554; 427/555; 427/255.19

(58) Field of Classification Search
None
See application file for complete search history.

(56) References Cited

U.S. PATENT DOCUMENTS

| | | | |
|---|---|---|---|
| 5,153,054 A * | 10/1992 | Depauw et al. ............... | 428/216 |
| 5,598,285 A | 1/1997 | Kondo et al. | |
| 5,650,597 A | 7/1997 | Redmayne | |
| 5,838,037 A | 11/1998 | Masutani et al. | |
| 5,926,702 A | 7/1999 | Kwon et al. | |
| 6,016,178 A | 1/2000 | Kataoka et al. | |
| 6,177,918 B1 | 1/2001 | Colgan et al. | |
| 6,204,897 B1 | 3/2001 | Colgan et al. | |
| 6,356,335 B1 | 3/2002 | Kim et al. | |
| 6,362,028 B1 | 3/2002 | Chen et al. | |
| 6,580,093 B2 | 6/2003 | Chung et al. | |
| 6,884,569 B2 | 4/2005 | Nakashima | |

(Continued)

FOREIGN PATENT DOCUMENTS

| | | |
|---|---|---|
| EP | 0 104 870 | 4/1984 |
| EP | 0 733 931 | 9/1996 |
| FR | 2 936 241 | 3/2010 |

OTHER PUBLICATIONS

International Search Report mailed Sep. 9, 2012.

(Continued)

*Primary Examiner* — Timothy Meeks
*Assistant Examiner* — Ina Agaj
(74) *Attorney, Agent, or Firm* — Nixon & Vanderhye P.C.

(57) ABSTRACT

Certain examples relate to improved methods for making patterned substantially transparent contact films, and contact films made by such methods. In certain cases, the contact films may be patterned and substantially planar. Thus, the contact films may be patterned without intentionally removing any material from the layers and/or film, such as may be required by photolithography. In certain example embodiments, an oxygen exchanging system comprising at least two layers may be deposited on a substrate, and the layers may be selectively exposed to heat and/or energy to facilitate the transfer of oxygen ions or atoms from the layer with a higher enthalpy of formation to a layer with a lower enthalpy of formation. In certain cases, the oxygen transfer may permit the conductivity of selective portions of the film to be changed. This advantageously may result in a planar contact film that is patterned with respect to conductivity and/or resistivity.

27 Claims, 7 Drawing Sheets

(56) References Cited

U.S. PATENT DOCUMENTS

| | | |
|---|---|---|
| 7,071,036 B2 | 7/2006 | Yang |
| 7,215,331 B2 | 5/2007 | Song et al. |
| 7,372,510 B2 | 5/2008 | Abileah |
| 7,408,606 B2 | 8/2008 | Shih |
| 7,436,393 B2 | 10/2008 | Hong et al. |
| 7,589,799 B2 | 9/2009 | Lai |
| 7,601,436 B2 | 10/2009 | Djurovich et al. |
| 7,602,360 B2 | 10/2009 | Park |
| 7,629,741 B2 | 12/2009 | Liao et al. |
| 7,659,661 B2 | 2/2010 | Park |
| 7,662,663 B2 | 2/2010 | Cok et al. |
| 7,663,311 B2 | 2/2010 | Im et al. |
| 7,663,312 B2 | 2/2010 | Anandan |
| 2004/0119403 A1 | 6/2004 | McCormick et al. |
| 2004/0229073 A1 | 11/2004 | Dietrich et al. |
| 2009/0004412 A1 | 1/2009 | Decroupet et al. |
| 2011/0100445 A1* | 5/2011 | Krasnov .................. 136/256 |

OTHER PUBLICATIONS

"Evolution and Tailoring of Plasmonic Properties in Ag: $ZrO_2$ Nanocomposite Films by Swift Heavy Ion Irradiation"; Kumar et al., Journal of Applied Physics 109 (2011).

U.S. Appl. No. 13/174,349, filed Jun. 30, 2011, Krasnov et al.
U.S. Appl. No. 12/923,842, filed Oct. 8, 2010, Veerasamy et al.
U.S. Appl. No. 12/926,713, filed Dec. 6, 2010, Alvarez.
U.S. Appl. No. 12/292,406, filed Nov. 18, 2008, Krasnov.
U.S. Appl. No. 13/020,987, filed Feb. 4, 2011, Krasnov et al.

* cited by examiner

PLANAR PATTERNED TRANSPARENT CONTACT, DEVICES WITH PLANAR PATTERNED TRANSPARENT CONTACTS, AND/OR METHODS OF MAKING THE SAME

Certain example embodiments relate to methods for making patterned substantially transparent contact films, and contact films and/or electronic devices made by such methods. In certain example instances, the contact films may be patterned but still remain substantially planar. In other words, the contact films may be patterned without intentionally removing any material from the layers and/or film, such as may be required by processes such as photolithography and the like.

BACKGROUND AND SUMMARY OF CERTAIN EXAMPLE EMBODIMENTS

Electronic devices are known in the art. One type of electronic device is a display device, which may include, for example, LCD devices, LED devices, OLED devices, plasma displays, flat panel display devices, touch screen devices, and/or the like. In certain cases, electronic devices may include patterned transparent electrodes, thin-films, and/or contacts. As will be appreciated, "patterned" may mean patterned with respect to conductivity and/or resistance, in some cases. In some instances, these patterned films may be addressable (e.g., via a TFT array) and may comprise a grid and/or matrix-like pattern of conductive and resistive portions of the film. In many cases, it may be desirable to provide an electrode and/or contact comprising both conductive and resistive portions in order for display devices and/or touch screen devices to function properly, e.g., as in the case with an active matrix LCD device.

The fabrication of conventional patterned transparent contacts for electronic devices typically includes depositing a continuous transparent conductive oxide layer (TCO), followed by a multi-step photolithography process to remove portions of the TCO. For instance, indium tin oxide (ITO) often is deposited on a glass substrate as a blanket layer via sputtering. The sputtered blanket layer is oftentimes patterned using a photolithographic process that includes application of a photoresist material (typically via spin coating), soft baking, exposure, hard baking, etching, and washing.

FIG. 1 is a cross-sectional view of a conventional patterned contact. As can be appreciated from FIG. 1, a TCO (e.g., ITO or the like) is disposed as a blanket layer on a substrate 1. The TCO is patterned into plural spaced apart and patterned islands 3 via photolithography, thereby defining the transparent contact. It will be appreciated that there is a step pattern and that the contact is not continuously planar.

Although photolithography is widely used, it has its drawbacks. For instance, photolithography involves many steps and many intermediate materials, increasing the time and costs associated with the products. The process in general also may increase the probability of defects during formation of the patterned layer, e.g., as a result of misalignment of the photoresist, problems with baking, incorrect exposure and/or etching, incomplete removal of the photoresist, etc. The photolithographic process also typically leaves sharp steps or "horns" that can affect subsequently applied layers and/or materials. As an example, organic light-emitting diodes (OLEDs) may be especially susceptible to this effect. Further, because in some cases the TCO material may have a refractive index that differs from the refractive index of the substrate upon which it is deposited, when portions of the TCO are removed, the visual appearance of the substrate and/or coating will appear non-uniform because of the partial presence of the TCO coating and its refractive index differences. Indeed, a typical TCO typically has an index of refraction about 2.0, whereas the supporting glass substrate typically will have an index of about 1.5. Thus, the photolithography process may result in a non-uniform appearance of the visual appearance of the article, which is an additional disadvantage. ITO itself is a high cost, and the earth's supply of indium, itself a hazardous material, also is running low.

Thus, it will be appreciated by one skilled in the art that it would be desirable to provide improved methods for forming patterned contacts, and/or electronic device made by such methods.

One aspect of certain example embodiments relates to a naturally planar thin-film transparent conductive contact, selectively patterned by means of radiative heat or the like.

Another aspect of certain example embodiments relates to a transparent contact that may include at least two adjacent layers, wherein the first layer is highly conductive and transparent (at least in the visible spectrum) with conductivity strongly dependent on the oxidation state and wherein the second layer is a transparent layer able to exchange oxygen in form of ions or atoms with the first layer at elevated temperatures.

In certain instances, the first layer is sub-oxidized and the second layer is oxidized during the deposition; and the oxygen is transferred from the second layer to the first layer to substantially suppress the conductivity during subsequent heat, IR, UV, or other exposure. In certain instances, the first layer is oxidized and the second layer is sub-oxidized during the deposition; and the oxygen is transferred from the first layer to the second layer during subsequent heat, IR, UV, or other exposure.

In some cases, the whole area of the film stack is non-conducting as deposited and becomes conductive only in the areas exposed to heat or other energy. In some cases, the whole area of the film stack is conductive as deposited and becomes non-conductive only in the areas exposed to heat or other energy.

In certain example embodiments, the selective change in the conductivity significantly affects the optical parameters of the layers only in the NIR spectral region and not in the visible, so there is very little or no noticeable difference in the visual appearance between the conductive and non-conductive areas.

In certain example embodiments, two layers may be deposited on a substrate. In certain instances, one layer may be substantially conductive and the other may be at least partially (and possibly fully) oxidized. In certain other instances, both layers may be at least partially oxidized. The layers may be selectively exposed to heat, radiation, and/or energy in order to facilitate the transfer of oxygen atoms between the layers. In some instances, the oxygen atoms may flow from the layer with a higher enthalpy of formation to the layer with the lower enthalpy of formation. In certain cases, this oxygen transfer may permit the conductivity of selective portions of the film to be changed. This advantageously may result in a planar contact film that is patterned with respect to conductivity and/or resistivity.

Certain example embodiments also relate to the use of planar transparent contacts in display, flat panel, touch screen, and/or other electronic devices, e.g., as an alternative to the more ubiquitously employed non-planar contact made via photolithography processes. The planar patterned contact and methods for making planar patterned contacts as described herein are based on, in some examples, the selective change of the conductivity at certain points in planar, thin-film layers. In certain example embodiments, this may be achieved through the application of heat, radiation, and/or energy (e.g., infrared radiation) to at least two thin films and/or layers. The application of heat, radiation, and/or energy in some cases may stimulate and/or facilitate the transfer of atoms affecting conductivity (e.g., oxygen atoms) between the layers. In some cases, this may create a matrix of conductive and non-conductive regions, depending on the original composition of the layers as-deposited, and/or where heat, radiation, and/or energy has been applied.

Certain example embodiments of this invention relate to a method of making a coated article comprising a multi-layer thin-film coating supported by a substrate. A conductive layer is disposed on the substrate. A sub-oxidized buffer layer is disposed on the conductive layer. An over-oxidized layer is disposed on the sub-oxidized. Energy is selectively applied to one or more portions of the coating, with the selective application of energy causing oxygen in the over-oxidized layer to migrate downward into the conductive layer to increase the resistivity of the conductive layer at the one or more portions. After the selective application of energy, the multi-layer thin-film coating is substantially planar and patterned with respect to conductivity and/or resistivity.

Certain example embodiments of this invention relate to a method of making an electronic device. A coated article including a glass substrate supporting a multi-layer thin-film coating is provided, with the multi-layer thin-film coating comprising, in order moving away from the substrate: a seed layer comprising Zn, Sn, and/or an oxide thereof, a layer comprising Ag that is conductive as deposited, a sub-oxidized buffer layer, and an over-oxidized dielectric layer. A first set of portions in the layer comprising Ag that are to be conductive portions is defined, and a second set of portions in the layer comprising Ag that are to be non-conductive portions also is defined. The coating is exposed to energy, from an energy source, in areas over the second set of portions so as to cause migration of oxygen ions or atoms from the over-oxidized dielectric layer to the layer comprising Ag and pattern the layer comprising Ag with respect to conductivity and/or resistivity. The coated article having the patterned layer comprising Ag is built into an electronic device.

Certain example embodiments of this invention relate to a method of making a coated article comprising a multi-layer thin-film coating supported by a substrate. A first layer comprising Ag and O is disposed on the substrate, with the first layer at least initially being non-conductive. A sub-oxidized buffer layer is disposed on the first layer. Energy is selectively applied to the coating proximate to the one or more portions of the first layer so as to cause oxygen at the one more portions therein to migrate upward into the sub-oxidized buffer layer to increase conductivity of the first layer at the one or more portions. After the selective application of energy, the multi-layer thin-film coating is substantially planar and patterned with respect to conductivity and/or resistivity.

Certain example embodiments of this invention relate to a method of making an electronic device. A coated article including a glass substrate supporting a multi-layer thin-film coating is provided, with the multi-layer thin-film coating comprising, in order moving away from the substrate: a seed layer comprising Zn, Sn, and/or an oxide thereof, a layer comprising Ag and O that is non-conductive as deposited, and a sub-oxidized buffer layer. A first set of portions in the layer comprising Ag and O that are to be conductive portions is defined, and a second set of portions in the layer comprising Ag and O that are to be non-conductive portions is defined. The coating, including the layer comprising Ag and O, is exposed to energy, from an energy source, in areas over the first set of portions so as to cause migration of oxygen ions or atoms from the layer comprising Ag and O into the sub-oxidized buffer layer and pattern the layer comprising Ag and O with respect to conductivity and/or resistivity. The coated article having the patterned layer comprising Ag is built into an electronic device.

These and other embodiments, features, aspect, and advantages may be combined in any suitable combination or sub-combination to produce yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF CERTAIN EXAMPLE EMBODIMENTS

Certain example embodiments of this invention relate to techniques for making a planar multi-layer transparent contact without employing a photolithography process. The selective change of a thin-film material's conductivity may be achieved by applying energy (e.g., from one or more infrared (IR) or UV radiation sources, through heating, using a laser, and/or the like, e.g., through a close-proximity mask) to a combination of at least two thin films. The application of energy stimulates the transfer of ions or atoms affecting conductivity (e.g., oxygen ions) between the two layers, thus selectively creating areas of high conductivity and high resistivity.

Certain example embodiments may, for example, use a combination of conductive and an over-oxidized layers, where the oxygen is transferred from the over-oxidized layer to the conductive layer thereunder, e.g., using IR irradiation, thus making the conductive layer selectively non-conducting in the desired areas. In certain instances, Ag may be used as the conductive layer in connection with over-oxidized TiOx, ZrOx, and/or the like. An additional substantially sub-oxidized ultra-thin buffer layer may be introduced between the conductive layer and the over-oxidized layer to help reduce the likelihood of oxidation of the conductive layer during the deposition. In certain other example embodiments, ions or atoms from a non-conductive layer (e.g., including Ag) may be forced upward into a thin sub-oxidized buffer layer and/or a protective layer, thereby helping to create areas of high conductivity in the originally non-conductive layer.

Certain example embodiments thus advantageously provide an inexpensive and naturally planar transparent contact. In addition, or in the alternative, certain example embodiments reduce the likelihood of detectable visual differences between the conducting and non-conducting areas.

The example techniques described herein may be used in place of, or together with, conventional ITO-based non-planar contacts found in flat-panel displays (e.g., LCD displays, plasma display panels, OLED displays, OLED lighting, etc.), touch-panel screens, and/or other popular electronic devices.

Figure 1:
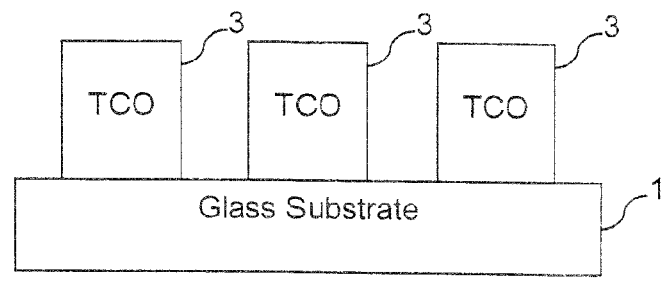
FIG. 1 is a cross-sectional view of a conventional patterned contact.
Figure 2:
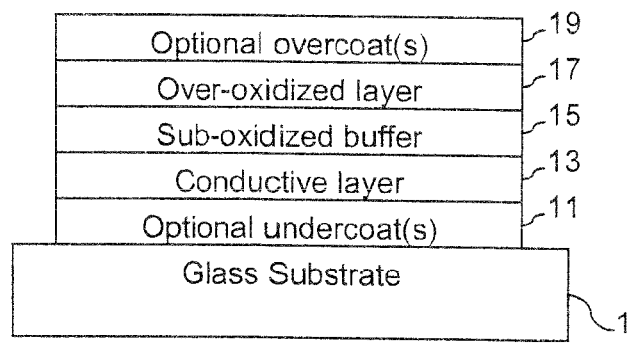
FIG. 2 is a cross-sectional view of an intermediate product used to make a planar patterned contact according to certain example embodiments.
Figure 3:
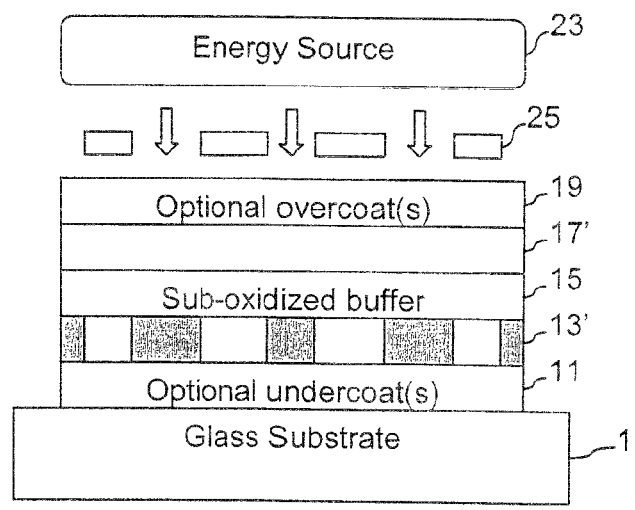
FIG. 3 is a cross-sectional view demonstrating how the intermediate product in FIG. 2 may be used to produce a planar patterned contact according to certain example embodiments.

FIG. 2 is a cross-sectional view of an intermediate product used to make a planar patterned contact according to certain example embodiments, and FIG. 3 is a cross-sectional view demonstrating how the intermediate product in FIG. 2 may be used to produce a planar patterned contact according to certain example embodiments. As shown in the FIG. 2 example embodiment, a highly conductive and transparent metal layer 13 (e.g., of or including Ag) and a dielectric layer 17 (including, for example, ZrOx, TiOx, etc.) are provided in close relative proximity to one another. The dielectric layer 17 can relatively easily exchange oxygen with the metal in the conductive layer 13 when exposed to an energy source, e.g., during heat treatment, exposure to a laser, irradiation with IR and/or UV energy, etc. This activation causes oxygen to migrate from the dielectric layer 17 into areas of the conductive layer 13 in a controllable manner, creating selective areas of high resistivity. The dielectric layer 17 may be over-oxidized to facilitate this process in certain example embodiments. In certain other example embodiments, however, the dielectric layer 17 may be fully oxidized or even partially oxidized.

For example, layer 17 may be any transparent material such as, for example, a dielectric, a transparent semiconductor, a transparent metal or a combination of the above. Examples include TiOx, metallic Zr, ZrOx, ZrTiOx, ZrAlOx, InSnOx, ZrNbOx, ITO, and/or the like. Layer 17 may be from about 10-400 nm in thickness, more preferably from about 30-300 nm, and most preferably from about 5-250 nm. Layer 17 may be sputter deposited from a metallic target, a ceramic target and/or by means of reactive sputtering. In certain examples, layer 17 may be deposited via a zirconium target with an oxygen flow rate of from about 3 to 25 sccm. The argon to oxygen ratio may be from about 50:1 to about 2:1. When layer 17 comprises more than one material, layer 17 may be deposited from an alloy target and/or by means of co-sputtering (from more than one target).

One or more optional undercoats 11 may be provided in different embodiments of this invention, e.g., between the substrate 1 and the conductive layer 13. An undercoat layer 11 may be a seed layer (e.g., of or including stoichiometric zinc oxide, tin oxide, or any suitable TCO material) to promote a better quality of Ag or other metal layer disposed thereon. The undercoat layer 11 alternatively or in addition may help serve as a barrier layer (e.g., to help reduce sodium migration in the event that the substrate 1 is a soda lime silica glass substrate). A silicon-inclusive layer (e.g., an oxide and/or nitride of or including silicon) may be used for such purposes in certain example embodiments. In still other example embodiments, one or more index matching layers may be provided to improve the optical properties of the layer stack system. For example, one or more high index/low index layer stacks may be provided, as may high/low/medium index stacks, and/or the like. Tin oxide, titanium oxide, silicon oxide, silicon nitride, silicon oxynitride, and/or other materials may be used for index matching, color matching, and/or other purposes in different embodiments of this invention.

One or more optional overcoats 19 also may be provided in different embodiments of this invention. The optional overcoat 19 may serve as an encapsulating cap layer on the top of the layer stack to slow or otherwise reduce the likelihood of long-term degradation. Suitable materials include, for example, TiOx, ZrOx, SiOx, SixNy, SiOxNy, etc.

As shown in FIGS. 2-3, a sub-oxidized buffer layer 15 may be interposed between the conductive layer 13 and the dielectric layer 17 in certain example embodiments. The inclusion of this buffer layer has been found to reduce (and sometimes prevent) oxidation of the conductive layer 15 during the deposition. This layer may be sub-oxidized in certain example embodiments of this invention. Suitable materials include, for example, sub-oxidized ZrOx, metallic Zr, ZrTiOx, ZrAlOx, ITO, ZrNbOx, TiOx, SnOx, TiOx, etc. In certain example embodiments, the buffer layer 15 may be 0.1-30 nm thick, more preferable 0.3-20 nm thick, still more preferably 0.5-15 nm thick, and sometimes about 2 nm thick.

The contact can be initially made either conducting (e.g., using pure Ag followed by the sub-oxidized buffer and then by the over-oxidized layer) as shown in FIGS. 2-3. As indicated above, the selective conductivity inversion may be achieved by applying IR radiation (e.g., from a radiative heat source) by means of a short-wave or other IR heater or another type of oven with or without forced cooling, in vacuum or at atmospheric pressure. Heat irradiation can be performed through a close-proximity mask, optionally with heat insulation, in certain example embodiments.

As shown in FIG. 3, this results in initially conductive layer 13 becoming a patterned Ag layer 13' by virtue of oxygen ions or atoms flowing from the at least initially over-oxidized dielectric layer 17. The activation may convert the over-oxidized dielectric layer 17 into a fully oxidized or even slightly sub-oxidized dielectric layer 17' in certain example embodiments. In certain other example embodiments, however, depending on the amount of oxygen migrating from the dielectric layer 17 into the conductive layer 17 for example, the dielectric layer may remain over-oxidized.

Figure 4:
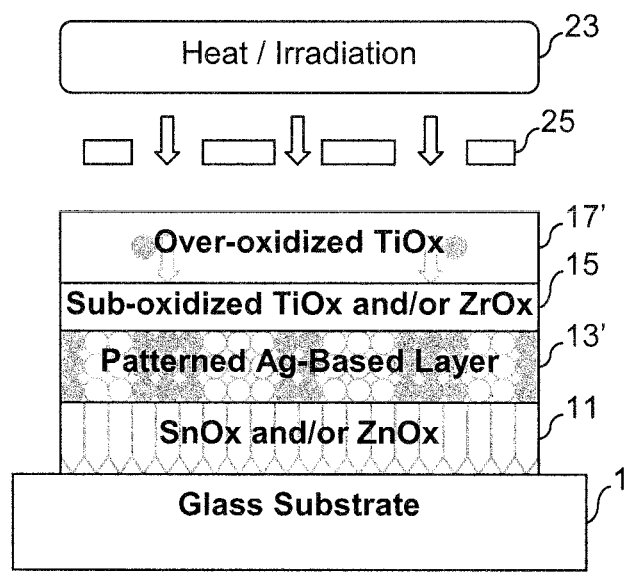
FIG. 4 is a more detailed cross-sectional view of the FIG. 3 example embodiment.

FIG. 4 is a more detailed cross-sectional view of the FIG. 3 example embodiment. As shown in FIG. 4, oxygen ions or atoms from the at least initially over-oxidized dielectric layer comprising TiOx 17' are forced, via the heat or irradiation source 23 through the sub-oxidized barrier layer 15 comprising TiOx and/or ZrOx and into the Ag-based layer, making it a patterned layer 13'.

In certain example embodiments, the surface temperature of the glass during the exposure is from 200-650 degrees C., and the surrounding air temperature is from 20-300 degrees C. Preferably, the surface temperature is kept to less than 800 degrees C., and the surrounding air temperature is kept to less than 500 degrees C. The exposure time may last from 5 sec to 10 minutes in different embodiments. Thus, in certain example embodiments, it will be appreciated that the process may be performed at ambient or elevated external temperature conditions, with the temperature of the glass preferably remaining below the melting or softening point of the glass.

The mask 25 helps control the areas of exposure such that, for example, only selective areas are patterned. As alluded to above, it may also be heat shielding, thereby helping to control the temperature of the glass in certain example embodiments. It will be appreciated, however, that a laser of a suitable resolution may not need such a mask 25. Heat treatment may be accomplished using a layer, with or without a mask, when the laser is operated at a suitable wavelength. For instance, a YAG laser with 1064 nm working wavelength may be used to impart the necessary energy to the selected areas in certain example embodiments.

Sheet resistance of the conductive portion of the contact can vary from 0.2 to 500 ohms/square, while the sheet resistance of the non-conductive portion may be at least about 50 ohms/square, more preferably at least about 100 ohms/square, still more preferably at least about 1,000 ohms/square, and sometimes may even exceed 1 MOhm/square in certain example embodiments. Sub-ranges of these broad ranges also are possible in different example embodiments. For instance, in connection with certain solar cell applications, a sheet resistance of less than 10 ohms/square may be desirable for the conductive portions, whereas a sheet resistance of less than 30-50 ohms/square may be sufficient when used in certain active-matrix LCD devices. In certain example embodiments, it may be possible to provide a sheet resistance ratio of better than 30,000:1, and in other example embodiments, it may be possible to provide a sheet resistance ratio of better than 100,000:1.

Figure 5:
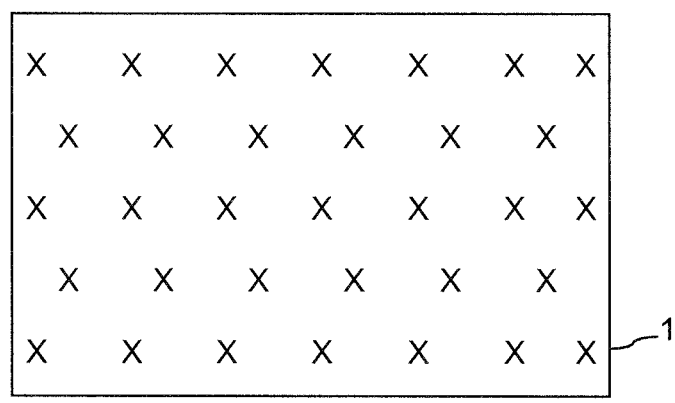
FIG. 5 is an example plan view of the grid-like matrix including the planar patterned contact of the FIG. 4 example embodiment.

FIG. 5 is an example plan view of the grid-like matrix including the planar patterned contact of the FIG. 4 example embodiment. The X-marks in FIG. 5 show the conductive portions of the substrate. A good abruptness of the contact is achieved as a result of the use of a close-proximity mask (and/or laser beam) and because of a low thermal conductivity of the ultra-thin Ag (or another conductive material) layer in the lateral direction. The change in conductivity of the selective areas therefore is achieved not because of the material removal, but because of the change in the physical properties of the material.

Although certain example embodiments have been described as including a conductive layer of or comprising Ag, other materials may be used in different embodiments of the invention. For instance, the conductive layer may be of or include gold, platinum, palladium, silver and/or combinations thereof. Other materials that are sufficiently transparent in the visible spectrum and allows high conductivity patterning in selective areas include, but are not limited to, zirconium, indium, tin, and/or titanium, and compounds containing the same (e.g., AgZr, AgIn, AgSn, AgTi, and/or the like).

The conductive layer 13 may be from about 1-50 nm in thickness, more preferably from about 3-25 nm, and most preferably from about 5-15 nm. The conductive layer 13 may be sputter deposited from a metallic target, a ceramic target and/or by means of reactive sputtering. When the conductive layer 13 comprises more than one material, it may be deposited from an alloy target and/or by means of co-sputtering (from more than one target).

Figure 6:
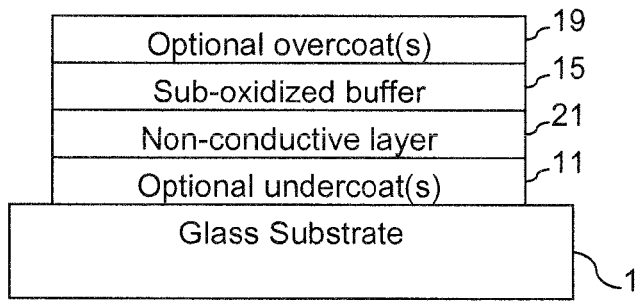
FIG. 6 is a cross-sectional view of another intermediate product used to make a planar patterned contact according to certain example embodiments.
Figure 7:
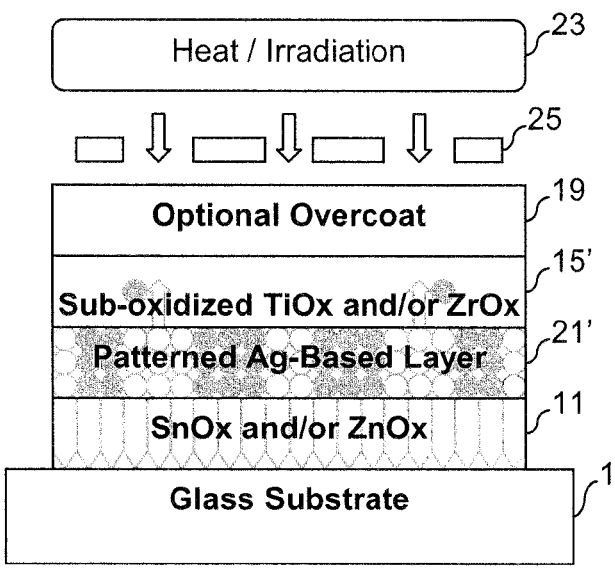
FIG. 7 is a cross-sectional view demonstrating how the intermediate product in FIG. 6 may be used to produce a planar patterned contact according to certain example embodiments.

As indicated above, the contact can be initially made conducting in certain example embodiments. However, in certain other example embodiments, the contact may be made initially non-conducting. In such cases, a layer comprising oxidized Ag (e.g., AgO, $Ag_2O$, $AgO_x$ where $0.1 \leq x \leq 1$, more preferably $0.2 \leq x \leq 0.8$, and most preferably $x <= 0.5$) or the like may be disposed on the substrate, followed by a sub-oxidized layer such as, for example, a layer comprising TiOx, ZrOx, or other suitable material. In this regard, FIG. 6 is a cross-sectional view of another intermediate product used to make a planar patterned contact according to certain example embodiments, and FIG. 7 is a cross-sectional view demonstrating how the intermediate product in FIG. 6 may be used to produce a planar patterned contact according to certain example embodiments. The initially disposed non-conductive layer 21 may be of or include AgO, $Ag_2O$, or other suitable material. It may support a sub-oxidized buffer layer 15 that helps reduce the likelihood of further oxidization of the non-conductive layer 21 during deposition. However, it may also or in addition, may serve as a receptacle for oxygen ions or atoms migrating out from the non-conductive layer 21. For instance, as shown in FIG. 7, the heat or irradiation source 23 may cause oxygen atoms to migrate into the sub-oxidized layer 15', creating a patterned Ag-based layer 21'.

Figure 8:
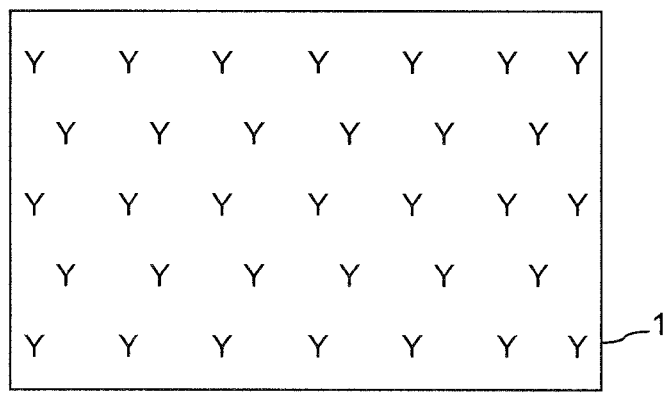
FIG. 8 is an example plan view of the grid-like matrix including the planar patterned contact of the FIG. 7 example embodiment.

FIG. 8 is an example plan view of the grid-like matrix including the planar patterned contact of the FIG. 7 example embodiment. FIG. 8 thus is similar to FIG. 5, except that the Ys in FIG. 8 indicate portions of high resistivity in the planar patterned contact on the substrate 1.

It will be appreciated that the contact, whether produced by causing oxygen ions or atoms to migrate into a conductive layer or out from a dielectric or non-conductive metal oxide layer, may be substantially planar. In certain example embodiments, materials may not be intentionally removed to create patterned areas. Rather, as described above, changes in the physical properties of the material may be brought about by virtue of the selective exposure to energy sources. In certain example embodiments, the planar patterned contact may have a substantially uniform thickness, preferably deviating in thickness less than 25%, more preferably less than 20%, and sometimes deviating less than 10-15%. In certain example embodiments, the overall flatness may be the same as or better than that achievable by photolithographic techniques.

Figure 9:
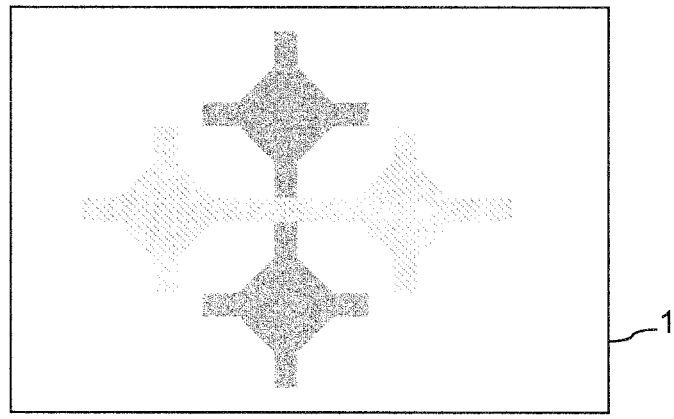
FIG. 9 is an example plan view of a diamond-like array including a planar patterned contact in accordance with certain example embodiments.

Although certain example embodiments have been described as relating to patterned rows and/or columns (e.g., in a matrix-like arrangement), other patterns are possible in different embodiments of this invention. For example, FIG. 9 is an example plan view of a diamond-like array including a planar patterned contact in accordance with certain example embodiments. The techniques described herein may be used to create one or more patterned rows and/or one or more patterned columns in an array-like arrangement, in the FIG. 9 example diamond-like, or any other suitable arrangement.

As indicated above, the heat, radiation, and/or energy selectively applied may cause oxygen atoms in certain layers to flow into certain other layers. Thus, as indicated above, the contact may be initially conductive or non-conductive. This is because when the heat, radiation, and/or energy is selectively applied, the oxygen will flow from areas of higher enthalpy of formation to areas of lower enthalpy of formation at certain positions in the contact. In other words, in certain example embodiments, oxygen atoms or ions may be transferred from the layer with a higher enthalpy of formation to the layer with a lower enthalpy of formation when suitable excited.

As is known, enthalpy is a measure of the total energy of a thermodynamic system—including the internal energy (the energy required to create a system) and the amount of energy required to make room for it by displacing its environment and establishing its volume and pressure. Enthalpy typically is discussed in terms of the change in enthalpy of a system (delta H), which in some cases is equal to the change in the internal energy of the system, plus the work that the system has done on its surroundings. The change of enthalpy in such conditions is the heat absorbed or released by a chemical reaction. The enthalpy of formation of a substance is the change of enthalpy that accompanies the formation of a substance in its standard state from its constituent elements, in their standard state. The Theoretical standard enthalpy of formation for zirconium oxide (e.g., $ZrO_2$) is −1080 kJ/mol, whereas when a silver layer is deposited, if the layer comprises silver, mainly, the enthalpy of formation theoretically would be 0 (because no new compound is substantially forming) However, if a sub-oxide of zirconium oxide is formed, the enthalpy of formation may be different. The theoretical standard enthalpy of formation of silver oxide is −31.1 kJ/mol. It thus can be seen why oxygen would migrate from an over-oxidized ZrOx layer to an Ag-based layer, and why oxygen would migrate from a silver oxide inclusive layer to a sub-oxidized buffer layer.

In certain example embodiments, it may be possible to provide two substantially planar patterned contacts on a common side of a substrate. This may be accomplished if the depth of the laser and/or energy may be suitably limited or vertically controlled. Certain example embodiments may, however, provide planar patterned contacts on opposing sides of a substrate, e.g., to obtain suitable row and column addressing.

Figure 10:
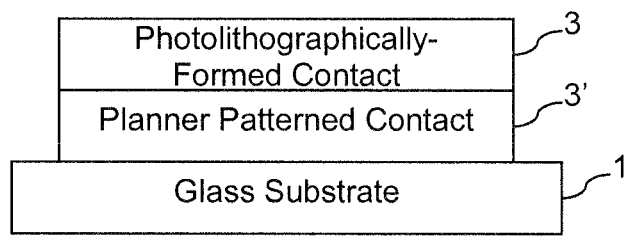
FIG. 10 is an example cross-sectional view demonstrating how a planar patterned contact may be used in connection with a photolithographically-formed contact in accordance with certain example embodiments.
Figure 11:
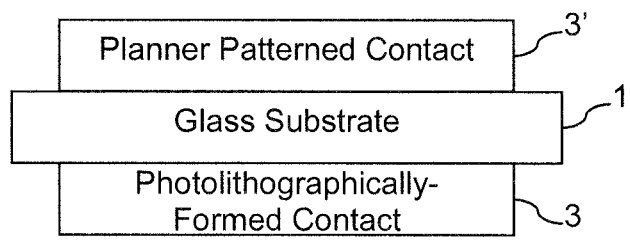
FIG. 11 is another example cross-sectional view demonstrating how a planar patterned contact may be used in connection with a photolithographically-formed contact in accordance with certain example embodiments.

In still other example embodiments, it may be possible to mix and match the planar patterned contact techniques described herein with more conventional photolithographic techniques. FIGS. 10-11, for example, are example cross-sectional views demonstrating how planar patterned contacts may be used in connection with photolithographically-formed contacts in accordance with certain example embodiments. As shown in FIG. 10, a planar patterned contact 3' may be disposed on a substrate 1. A photolithographically-formed contact 3 may be located over the planar patterned contact 3'. This may provide suitable row and column address in certain example embodiments. It will be appreciated, of course, that the positions of the planar patterned contact 3' and the photolithographically-formed contact 3 may be reversed, e.g., so that the photolithographically-formed contact 3 is adjacent to the substrate 1 and so that the patterned contact 3' is located on top of it. In contrast with FIG. 10, FIG. 11 shows a planar patterned contact 3' on a first major surface of the substrate 1 and a photolithographically-formed contact 3 on the opposite major surface of the substrate 1.

In certain example embodiments, silver agglomeration may be used as the or a part of the mechanism for promoting a conductivity change, along with oxidation changes, e.g., in cases where the silver layer is conductive as-deposited. The oxidation may promote agglomeration which, in turn, may result in discontinuity of the silver layer in the heat areas and which, in turn, may terminate conductivity.

In certain example embodiments, dopants such as Zr, Al, Ni, etc., may be added to the silver to help control (e.g., to lower) its threshold to agglomeration and/or oxidation. The dopant levels in certain example instances may be from 0.0001 wt % to 5 wt %, with 0.5 wt % being a preferable example level for dopants. Suitable dopants for Ag to reduce its oxidation—including Ti, Mg, Zr, Ni, Pd, PdCu, and Hf, for example,—may help to reduce the oxygen diffusion in the Ag and may also act as grain refiners.

Figure 12:
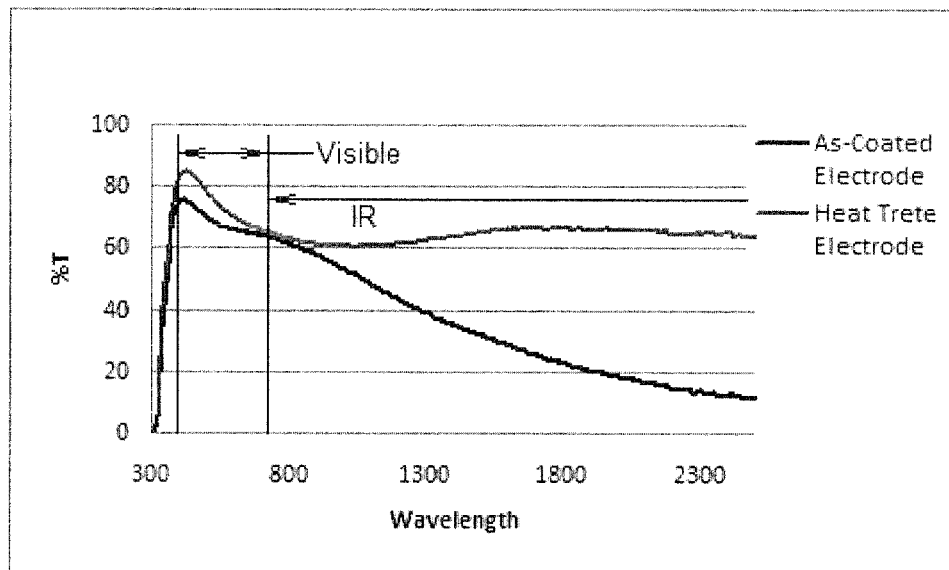
FIG. 12 is a graph showing the transmission of as-deposited and heat activated electrodes produced in accordance with certain example embodiments.

It has been found that the changes in electrical conductivity of the activated and non-activated areas of the planar patterned contact cause changes in the optical transmission primarily in the infrared range. This advantageously reduces the difference in visual appearance between the conducting and non-conducting regions of the contact. This is shown clearly in FIG. 12, which is a graph showing the transmission of as-deposited and heat activated electrodes produced in accordance with certain example embodiments. As can be seen from the FIG. 12 graph, there is almost no change in the UV spectrum between the as-coated electrode and the heat treated or otherwise activated electrode. The shift actually boosts transmission in the visible range, and the significant transmission gain is clearly in the infrared portion of the spectrum. In example applications where infrared transmission is a concern (e.g., in some flat panel display or other electronic device applications), a suitable IR filter may be provided so as to help reduce the effects of EMI.

Figure 13:
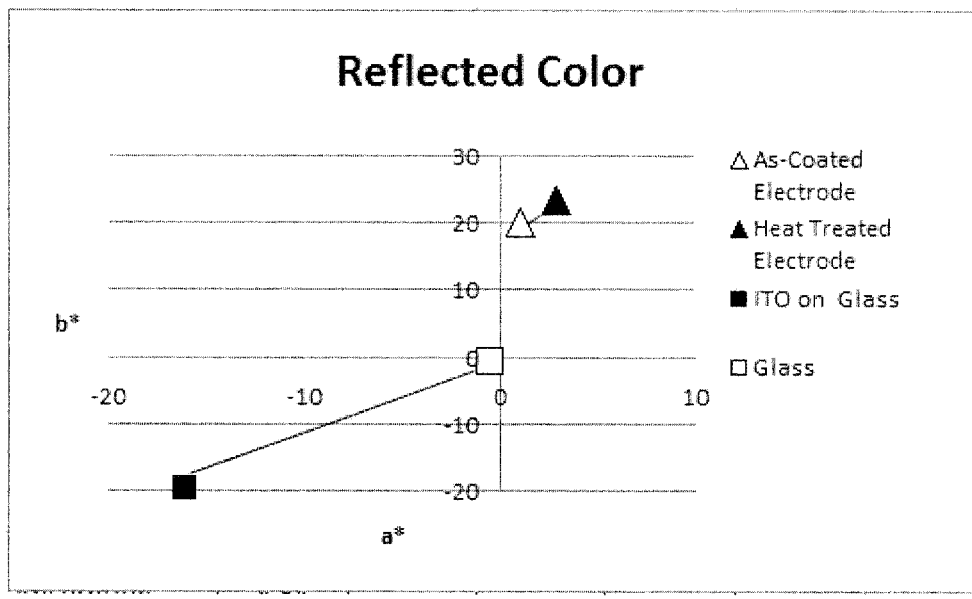
FIG. 13 is a graph showing the reflected color difference of as-deposited and heat-activated electrodes made in accordance with certain example embodiments of this invention, with the shift for ITO and bare glass also being shown for comparative purposes.
Figure 14:
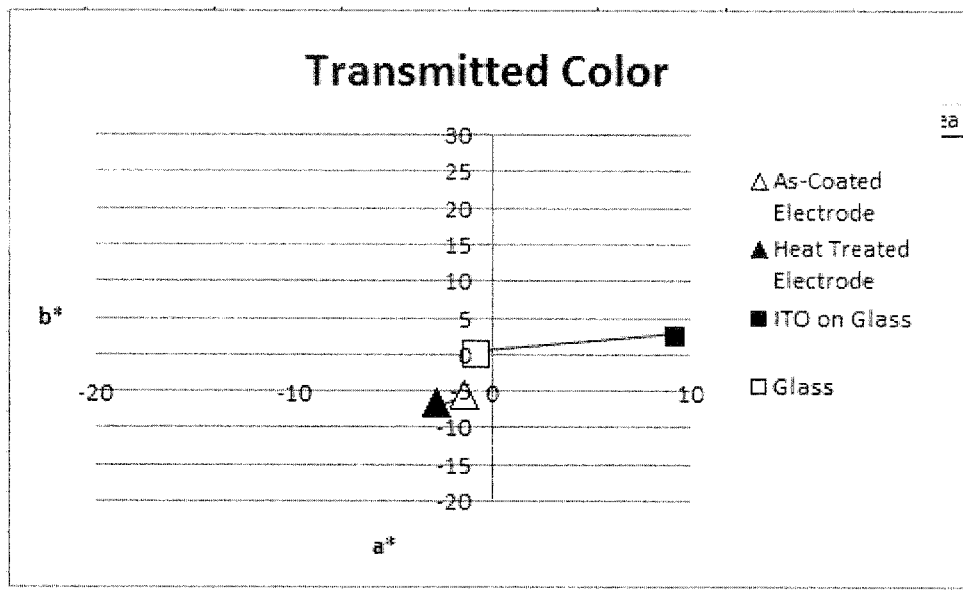
FIG. 14 is a graph showing the transmitted color difference of as-deposited and heat-activated electrodes made in accordance with certain example embodiments of this invention, with the shift for ITO and bare glass also being shown for comparative purposes.

FIG. 13 is a graph showing the reflected color difference of as-deposited and heat-activated electrodes made in accordance with certain example embodiments of this invention, with the shift for ITO and bare glass also being shown for comparative purposes; and FIG. 14 is a graph showing the transmitted color difference of as-deposited and heat-activated electrodes made in accordance with certain example embodiments of this invention, with the shift for ITO and bare glass also being shown for comparative purposes. As can be seen from these graphs, the delta a* and b* values for both reflected and transmitted colors are very low and compare extremely favorably to the shifts caused by deposition of ITO on glass. In certain example embodiments, delta a* for both reflected and transmitted color is less than 10, more preferably less than 5, and sometimes even less than or equal to 2 or 3. Similarly, in certain example embodiments, delta b* for both reflected and transmitted color is less than 10, more preferably less than 5, and sometimes even less than or equal to 2 or 3.

In certain example embodiments, there may be no significant color differences between the conducting and non-conductive areas. Advantageously, haze may be improved and indeed very close to 0 in certain example embodiments.

As indicated above, the planar patterned contacts described herein may be used in connection with a variety of electronic devices. An OLED is one type of electronic device that may benefit from the planar patterned contacts described herein. OLEDs are used in television screens, computer monitors, small, portable system screens such as mobile phones and PDAs, watches, advertising, information, indication, and/or the like. OLEDs may also sometimes be used in light sources for space illumination and in large-area light-emitting elements. OLED devices are described, for example, U.S. Pat. Nos. 7,663,311; 7,663,312; 7,662,663; 7,659,661; 7,629,741; and 7,601,436, the entire contents of each of which are hereby incorporated herein by reference. An organic light emitting diode (OLED) is a light-emitting diode (LED) in which the emissive electroluminescent layer is a film of organic compounds which emit light in response to an electric current. This layer of organic semiconductor material is situated between two electrodes in some cases. Generally, for example, at least one of these electrodes is transparent. One or both of these electrodes may be the transparent planar patterned contact as described herein.

As indicated above, an oxygen-exchanging system (e.g., bi-layer) also may be used in connection with OLED displays. A typical OLED comprises two organic layers—namely, electron and hole transport layers—that are embedded between two electrodes. The top electrode typically is a metallic mirror with high reflectivity. The bottom electrode typically is a transparent conductive layer supported by a glass substrate. The top electrode generally is the cathode, and the bottom electrode generally is the anode. ITO often is used for the anode. When a voltage is applied to the electrodes, the charges start moving in the device under the influence of the electric field. Electrons leave the cathode, and holes move from the anode in opposite direction. The recombination of these charges leads to the creation of photons with frequencies given by the energy gap (E=hv) between the LUMO and HOMO levels of the emitting molecules, meaning that the electrical power applied to the electrodes is transformed into light. Different materials and/or dopants may be used to generate different colors, with the colors being combinable to achieve yet additional colors.

Figure 15:
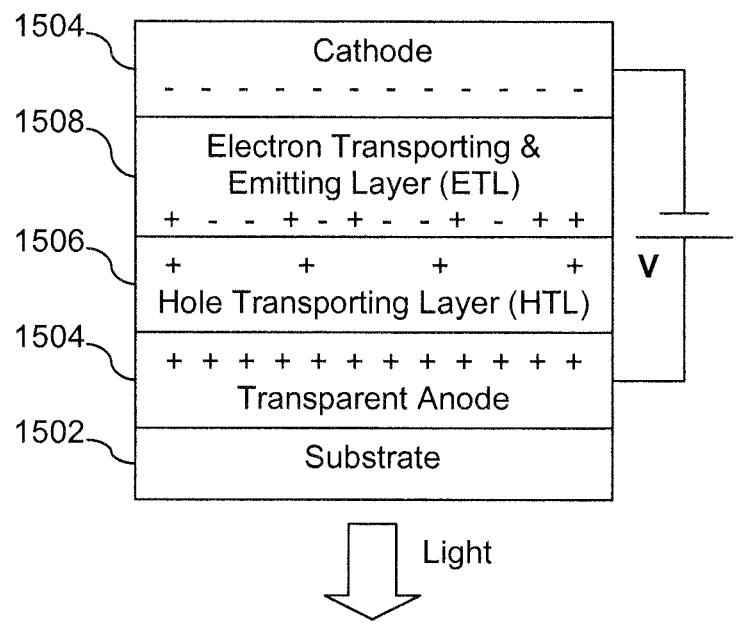
FIG. 15 is an example cross-sectional view of an OLED incorporating one or more planar patterned contact layers in accordance with an example embodiment.

FIG. 15 is an example cross-sectional view of an OLED incorporating one or more planar patterned contact layers in accordance with an example embodiment. The glass substrate 1502 may support a transparent anode layer 1504. The hole transmitting layer 1506 also may be a carbon nanotube (CNT) based layer, provided that it is doped with the proper dopants. Conventional electron transporting and emitting and cathode layers 1508 and 1510 also may be provided. As alluded to above, one or both of the anode layer 1504 and the cathode layer 1510 may benefit from the planar patterned contact techniques described herein.

These techniques similarly may be used in inorganic light emitting diode (ILED), polymer light emitting diode (PLED), and/or other applications. See, for example, U.S. application Ser. Nos. 12/923,842 and 12/926,713, which describe examples of such devices, and are hereby incorporated herein by reference.

Figure 16:
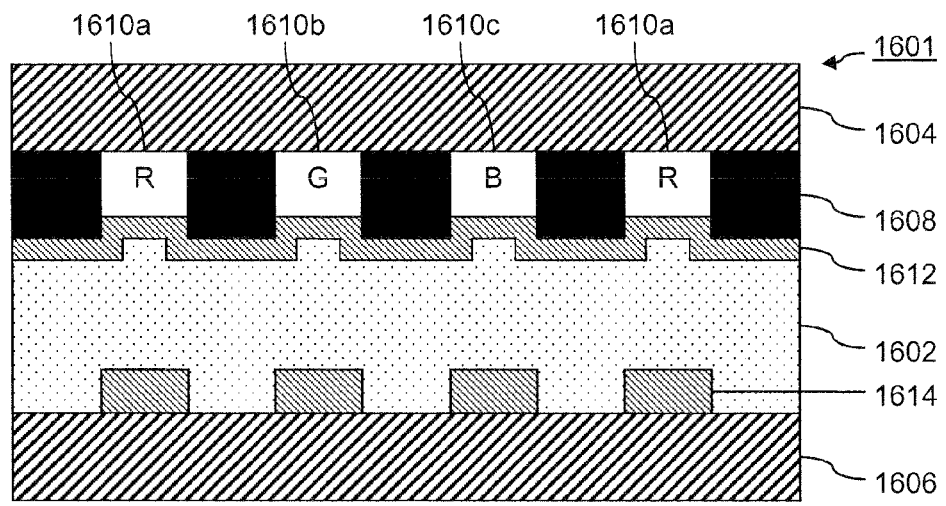
FIG. 16 is a cross-sectional view of an LCD display device incorporating one or more planar patterned contact layers in accordance with an example embodiment.

As also indicated above, the techniques described herein may be used in connection with LCD and/or other flat panel displays. LCD devices are known in the art. See, for example, U.S. Pat. Nos. 7,602,360; 7,408,606; 6,356,335; 6,016,178; and 5,598,285, as well as U.S. application Ser. No. 13/020,987, each of which is hereby incorporated herein in its entirety. FIG. 16 is a cross-sectional view of an LCD display device incorporating one or more planar patterned contact layers in accordance with an example embodiment. The display device 1601 generally includes a layer of liquid crystal material 1602 sandwiched between first and second substrates 1604 and 1606, and the first and second substrates 1604 and 1606 typically are borosilicate glass substrates. The first substrate 1604 often is referred to as the color filter substrate, and the second substrate 1606 often is referred to as the active or TFT substrate.

The first or color filter substrate 1604 typically has a black matrix 1608 formed thereon, e.g., for enhancing the color quality of the display. To form the black matrix, a polymer, acrylic, polyimide, metal, or other suitable base may be disposed as a blanket layer and subsequently patterned using photolithography or the like. Individual color filters 1610 are disposed in the holes formed in the black matrix. Typically, the individual color filters often comprise red 1610a, green 1610b, and blue 1610c color filters, although other colors may be used in place of or in addition to such elements. The individual color filters may be formed photolithographically, by inkjet technology, or by other suitable technique. A common electrode 1612, typically formed from indium tin oxide (ITO) or other suitable conductive material, is formed across substantially the entirety of the substrate or over the black matrix 1612 and the individual color filters 1610a, 1610b, and 1610c.

The second or TFT substrate 1606 has an array of TFTs 1614 formed thereon. These TFTs are selectively actuatable by drive electronics (not shown) to control the functioning of the liquid crystal light valves in the layer of liquid crystal material 2. TFT substrates and the TFT arrays formed thereon are described, for example, in U.S. Pat. Nos. 7,589,799; 7,071,036; 6,884,569; 6,580,093; 6,362,028; 5,926,702; and 5,838,037, each of which is hereby incorporated herein in its entirety. Although not shown in FIG. 16, a light source, one or more polarizers, alignment layers, and/or the like may be included in a typical LCD display device. Cover glass also may be provided, e.g., to help protect the color filter substrate and/or other more internal components. The TFT substrate 1606 and/or the color filter substrate 1604 may support planar patterned contacts, e.g., as the patterned electrodes.

Figure 17:
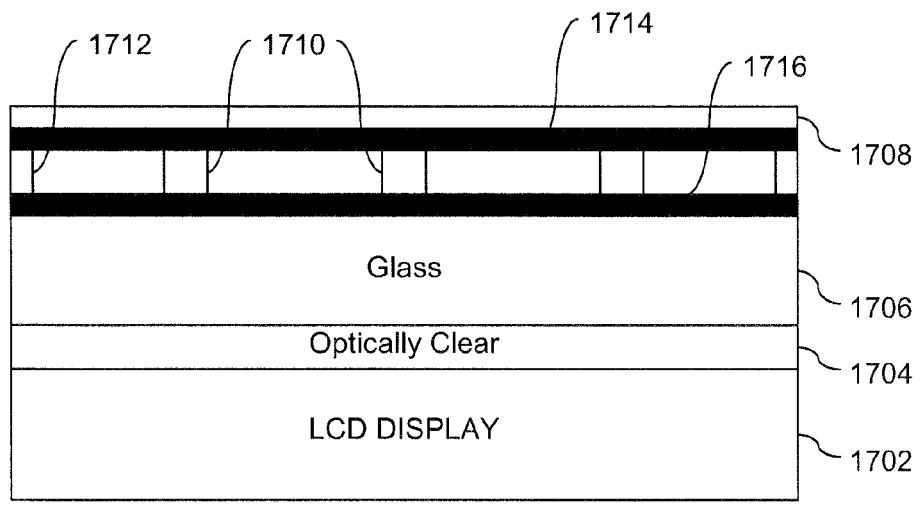
FIG. 17 is a cross-sectional schematic view of a touch screen incorporating one or more planar patterned contact layers in accordance with an example embodiment.

As also indicated above, the techniques described herein may be used in connection with touch panel devices. A touch panel display may be a capacitive or resistive touch panel display including the planar patterned contacts described herein or other conductive layers. See, for example, U.S. Pat. Nos. 7,436,393; 7,372,510; 7,215,331; 6,204,897; 6,177,918; and 5,650,597, and application Ser. No. 12/292,406, the disclosures of which are hereby incorporated herein by reference. For example, FIG. 17 is a cross-sectional schematic view of a touch screen incorporating one or more planar patterned contact layers in accordance with an example embodiment. FIG. 17 includes an underlying display 1702, which may, in certain example embodiments, be an LCD, plasma, or other flat panel display. An optically clear adhesive 1704 couples the display 1702 to a thin glass sheet 1706. A deformable PET foil 1708 is provided as the top-most layer in the FIG. 17 example embodiment. The PET foil 1708 is spaced apart from the upper surface of the thin glass substrate 1706 by virtue of a plurality of pillar spacers 1710 and edge seals 1712. First and/or second planner patterned contact layers 1714 and 1716 may be provided on the surface of the PET foil 1708 closer to the display 1702 and to the thin glass substrate 1706 on the surface facing the PET foil 1708, respectively. One or both may be patterned in accordance with the techniques set forth herein.

Although certain example electronic devices have been identified, the techniques disclosed herein may be used in connection with still other electronic devices including, for example, in solar photovoltaic applications, as gate or data lines in a variety of devices, etc.

It will be appreciated that an advantage of using the techniques described herein is that the contact may be made at lower costs than conventional ITO-based contacts. One enabler of the costs savings relates to the replacement of ITO with a comparatively inexpensive thin layer of silver. Another enabler of the costs savings relates to the elimination of the numerous steps and materials used in photolithography. The planar patterned contact advantageously has an increased durability because it is patterned in terms of conductivity and/or resistivity without interrupting the actual structure of the layer.

Although certain example embodiments have been described as using IR radiation for patterning, other example embodiments may use different techniques. For example, UV and/or visible laser wavelengths may be used in place of or in addition to IR. These techniques may sometimes be advantageous because IR may be at least partially reflected by the coating, whereas UV and/or some visible wavelengths may be effectively absorbed by the layers other than the Ag and thus used for heating the stack. For instance, if UV is used, the energy may be absorbed by the seed layer (which may be a semiconductor with a bandgap suitable for absorption of the UV with the energy of about 3.0-3.6 eV). Thus, it may be possible in certain example embodiments to add the possible absorption of the heat from the UV energy by the seed layer and then transfer it to the over-oxidized layer.

Certain example embodiments described herein have been described as including thin-film layer stacks disposed on glass substrates. It will be appreciated that the glass substrates may be, for example, soda lime silica-based substrates or borosilicate glass substrates. In other example embodiments, however, the substrate may be a silicon wafer or chip. In still other example embodiments, the substrate may be a flexible and/or plastic-based polymeric material. In other words, the substrates described herein may be of any suitable material.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers there between.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a coated article comprising a multi-layer thin-film coating supported by a substrate, the method comprising:
    disposing a conductive layer on the substrate;
    disposing a sub-oxidized buffer layer on the conductive layer;
    disposing an over-oxidized layer on the sub-oxidized buffer layer;
    selectively applying energy causing oxygen in the over-oxidized layer to migrate downward into the conductive layer to increase the resistivity of the conductive layer at one or more portions,
    wherein, after selectively applying the energy, the multi-layer thin-film coating is substantially planar and patterned with respect to conductivity and/or resistivity.

2. The method of claim 1, wherein the over-oxidized layer has an enthalpy of formation that is higher than an enthalpy of formation of the conductive layer.

3. The method of claim 2, wherein the conductive layer at least initially comprises metallic Ag that is conductive, and wherein the over-oxidized layer at least initially comprises an oxide of titanium or an oxide of zirconium.

4. The method of claim 1, wherein the sub-oxidized buffer layer comprises an oxide of titanium or an oxide of zirconium.

5. The method of claim 4, wherein the sub-oxidized buffer layer is 0.5-10 nm thick.

6. The method of claim 1, wherein the substrate is a glass substrate, and the method further comprising disposing a seed layer on the glass substrate, the conductive layer being over and directly contacting the seed layer.

7. The method of claim 6, wherein the seed layer comprises zinc oxide.

8. The method of claim 1, further comprising disposing an overcoat layer comprising silicon oxide, silicon nitride and/or silicon oxynitride over the over-oxidized layer.

9. The method of claim 1, wherein following the selective application of energy, the resistivity of the conductive layer at the one or more portions is increased to at least 1 Mohm/square and wherein the resistivity of the conductive layer outside the one or more portions is less than 50 ohms/square.

10. The method of claim 1, wherein following the selective application of energy, a sheet resistance ratio of resistivity at the one or more portions of the conductive layer to areas of the conductive layer outside the one or more portions is at least about 30,000:1.

11. The method of claim 1, wherein following the selective application of energy, a sheet resistance ratio of resistivity at the one or more portions of the conductive layer to areas of the conductive layer outside the one or more portions is at least about 100,000:1.

12. The method of claim 1, wherein the selective application of energy is performed using a short-wave infrared or near-infrared energy source.

13. The method of claim 1, wherein the selective application of energy is performed using a YAG laser.

14. The method of claim 1, wherein the selective application of energy is performed through a heat-blocking mask interposed between a source of the energy and the coated article.

15. A method of making an electronic device, the method comprising:
    providing a coated article including a glass substrate supporting a multi-layer thin-film coating, the multi-layer thin-film coating comprising, moving away from the substrate:
        a seed layer comprising Zn, Sn, and/or an oxide thereof,
        a layer comprising Ag that is conductive as deposited,
        a sub-oxidized buffer layer, and
        an over-oxidized dielectric layer;
    defining a first set of portions in the layer comprising Ag that are to be conductive portions and a second set of portions in the layer comprising Ag that are to be substantially non-conductive portions;
    exposing the multi-layer thin-film coating to energy, from an energy source, in areas over the second set of portions so as to cause migration of oxygen ions or atoms from the over-oxidized dielectric layer to the layer comprising Ag and pattern the layer comprising Ag with respect to conductivity and/or resistivity; and
    providing the coated article having the patterned layer comprising Ag in an electronic device.

16. The method of claim 15, wherein the layer comprising Ag comprises metallic Ag, AgZr, AgIn, AgSn, and/or AgTi at least prior to the exposing.

17. The method of claim 15, wherein the sub-oxidized buffer layer at least initially comprises at least one of sub-oxidized zirconium oxide, Zr, an oxide of ZrTi, an oxide of ZrAl, ITO, and/or an oxide of ZrNb at least prior to the exposing.

18. The method of claim 15, wherein the over-oxidized dielectric layer comprises ZrOx at least one of an oxide of Zr, Zr, an oxide of ZrTi, an oxide of ZrAl, ITO, and/or an oxide of ZrNb at least prior to the exposing.

19. The method of claim 15, wherein the electronic device is a touch panel device.

20. The method of claim 15, wherein the electronic device is a flat panel display device.

21. The method of claim 15, wherein the multi-layer thin-film coating varies in thickness by no more than 15% after the exposing.

22. The method of claim 21, wherein optical differences along the multi-layer thin-film coating are imperceptible to a naked human eye.

23. The method or claim 1, wherein after selectively applying the energy the multi-layer thin-film coating is substantially planar and patterned with respect to conductivity.

24. The method of claim 1, wherein after selectively applying the energy the multi-layer thin-film coating is substantially planar and patterned with respect to resistivity.

25. The method of claim 1, wherein the conductive layer at least initially comprises Ag, and the over-oxidized layer at least initially comprises an oxide of titanium.

26. The method of claim 1, wherein the over-oxidized layer at least initially comprises an oxide of zirconium.

27. The method of claim 1, wherein the sub-oxidized buffer layer comprises an oxide of titanium.

* * * * *